(12) United States Patent
Kawaminami

(10) Patent No.: US 10,103,124 B2
(45) Date of Patent: Oct. 16, 2018

(54) SEMICONDUCTOR DEVICE

(71) Applicant: FUJITSU LIMITED, Kawasaki-shi, Kanagawa (JP)

(72) Inventor: Hironori Kawaminami, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 5 days.

(21) Appl. No.: 15/210,924

(22) Filed: Jul. 15, 2016

(65) Prior Publication Data

US 2017/0053900 A1  Feb. 23, 2017

(30) Foreign Application Priority Data

Aug. 17, 2015 (JP) .................. 2015-160579

(51) Int. Cl.
*H01L 29/40* (2006.01)
*H01L 25/065* (2006.01)
*H01L 23/48* (2006.01)
*H01L 23/528* (2006.01)

(52) U.S. Cl.
CPC ........ *H01L 25/0657* (2013.01); *H01L 23/481* (2013.01); *H01L 23/5286* (2013.01); *H01L 2224/0401* (2013.01); *H01L 2224/0557* (2013.01); *H01L 2224/1403* (2013.01); *H01L 2224/14181* (2013.01); *H01L 2224/16146* (2013.01); *H01L 2224/16148* (2013.01); *H01L 2224/16227* (2013.01); *H01L 2224/16235* (2013.01); *H01L 2224/16238* (2013.01); *H01L 2224/17181* (2013.01); *H01L 2225/06513* (2013.01); *H01L 2225/06527* (2013.01); *H01L 2225/06541* (2013.01); *H01L 2225/06544* (2013.01); *H01L 2225/06572* (2013.01); *H01L 2924/15192* (2013.01); *H01L 2924/15311* (2013.01)

(58) Field of Classification Search
CPC ............... H01L 25/0657; H01L 23/481; H01L 23/5286; H01L 2224/0401; H01L 2224/0557; H01L 2224/1403; H01L 2224/14181; H01L 2224/16146; H01L 2224/16148
USPC ........................................................ 257/621
See application file for complete search history.

(56) References Cited

U.S. PATENT DOCUMENTS

| 2009/0051035 | A1 | 2/2009 | Hirano |
| 2010/0155921 | A1 | 6/2010 | Saen et al. |
| 2010/0295189 | A1* | 11/2010 | Chou .................. H01L 23/525 257/777 |

(Continued)

FOREIGN PATENT DOCUMENTS

| JP | 2009-54702 | 3/2009 |
| JP | 2010-147221 | 7/2010 |

(Continued)

*Primary Examiner* — Elias M Ullah
(74) *Attorney, Agent, or Firm* — Fujitsu Patent Center

(57) ABSTRACT

A semiconductor device includes a first semiconductor chip including plural circuit blocks provided on a semiconductor substrate, and plural through-silicon vias that are arranged so as to surround the outer periphery of each of the plural circuit blocks and that penetrate the semiconductor substrate, and a second semiconductor chip that is stacked on the first semiconductor chip, and that is supplied with a power source through the plural through-silicon vias.

15 Claims, 19 Drawing Sheets

(56) References Cited

U.S. PATENT DOCUMENTS

2011/0266683 A1* 11/2011 Feng .................. H01L 23/3107
                                                      257/773
2012/0136596 A1    5/2012 Yamaoka et al.

FOREIGN PATENT DOCUMENTS

JP    2012-178425    9/2012
WO    2011-030467    3/2011

* cited by examiner

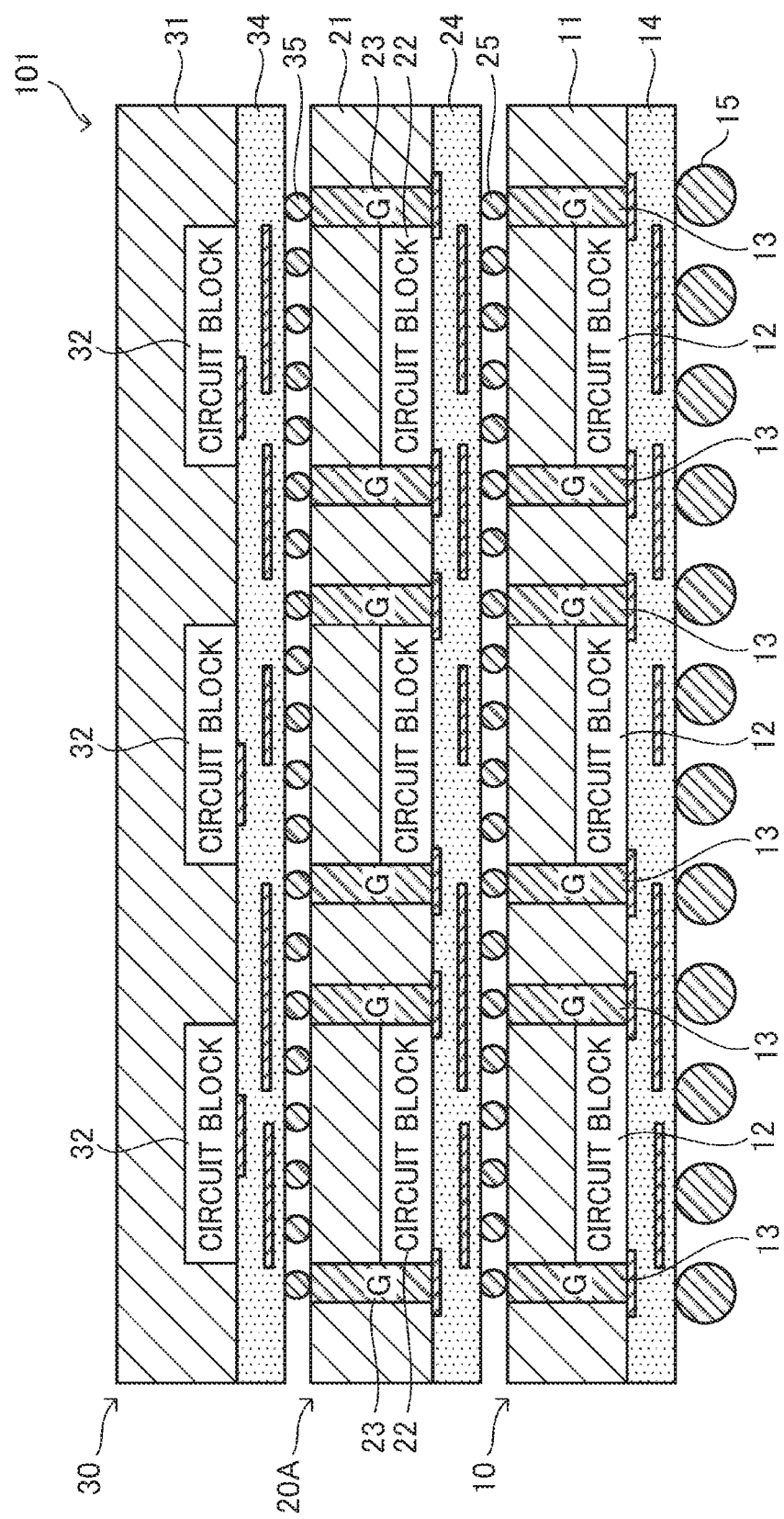

SEMICONDUCTOR DEVICE

CROSS-REFERENCE TO RELATED APPLICATION

This application is based upon and claims the benefit of priority of the prior Japanese Patent Application No. 2015-160579, filed on Aug. 17, 2015, the entire contents of which are incorporated herein by reference.

FIELD

The embodiments discussed herein are related to a semiconductor device.

BACKGROUND

The following technologies are known three dimensional packaging technology for semiconductor chips. For example, a semiconductor device is known that includes first, second, and third semiconductor chips, alternately stacked with first, second, and third through electrode groups for communication between the first to third semiconductor chips.

A semiconductor device is also known that includes a first circuit block formed on a first semiconductor substrate, and plural signal line through-silicon vias that conduct signals output from the first circuit block to a second circuit block formed on a second semiconductor substrate. This semiconductor device is provided with plural power source through-silicon vias for supplying a power source to the first circuit block, and the plural power source through-silicon vias are formed at an end of the first semiconductor substrate along the edge of the first semiconductor substrate.

A semiconductor device is also known that includes a second chip stacked on a first chip, wherein the second chip includes a first through electrode for receiving a supply of a first power source from the first chip, and a second through electrode for supplying a second power source from the second chip to the first chip.

The following technology is known as technology related to power source wiring structures inside semiconductor chips. For example, a semiconductor device is known that includes a first wiring layer formed from plural first wirings formed extending along a first direction, and a second wiring layer formed from plural second wirings formed in the first wiring layer and extending along a second direction that is orthogonal to the first direction.

RELATED PATENT DOCUMENTS

Japanese Laid-Open Patent Publication No. 2010-147221
International Publication (WO) No. 2011/030467
Japanese Laid-Open Patent Publication No. 2012-178425
Japanese Laid-Open Patent Publication No. 2009-54702

SUMMARY

According to an aspect of the embodiments, a semiconductor device includes a first semiconductor chip including a plurality of circuit blocks provided on a semiconductor substrate, and a plurality of through-silicon vias that are arranged so as to surround the outer periphery of each of the plurality of circuit blocks and that penetrate the semiconductor substrate, and a second semiconductor chip that is stacked on the first semiconductor chip, and that is supplied with a power source through the plurality of through-silicon vias.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a cross-section illustrating a configuration of semiconductor device according to a second exemplary embodiment of technology disclosed herein.

DESCRIPTION OF EMBODIMENTS

Figure 1:
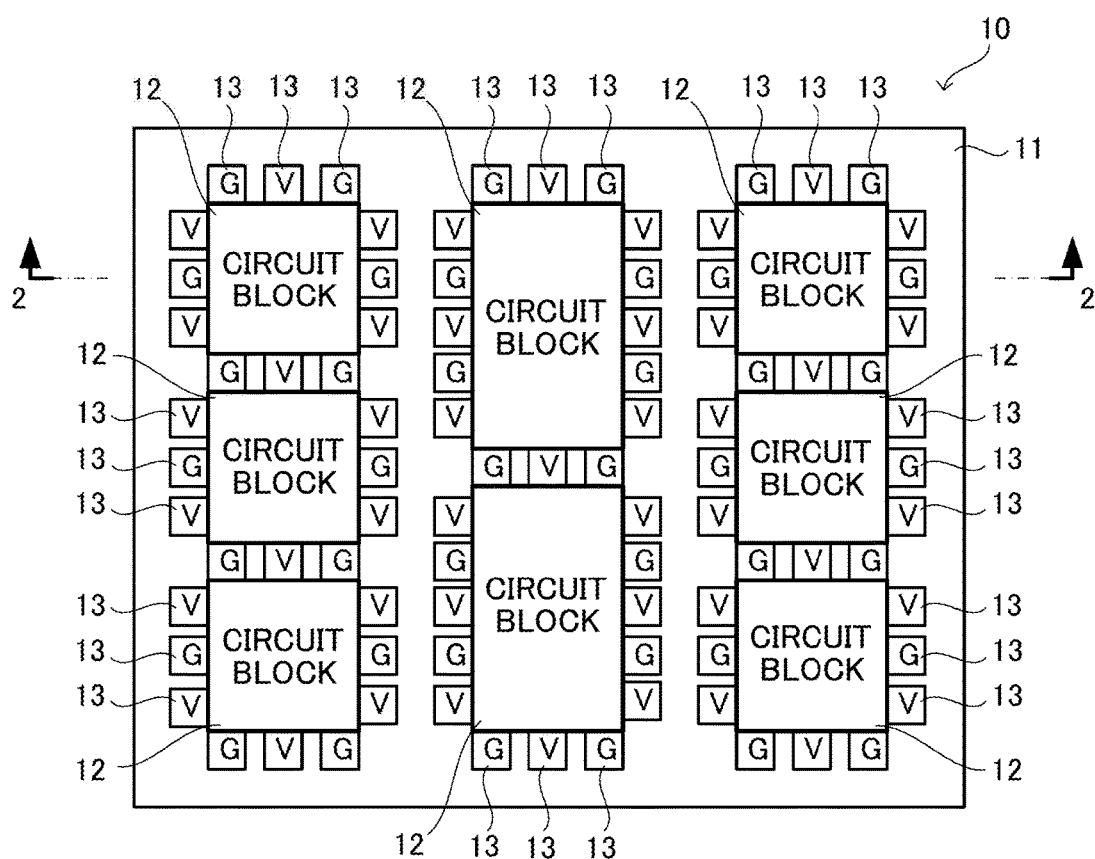
FIG. 1 is a plan view of a first semiconductor chip according to a first exemplary embodiment of technology disclosed herein.

Technology is known in which, in a semiconductor device configured by stacking plural semiconductor chips, a power source is supplied to an upper chip through a through-silicon via (TSV) provided at a lower chip. In such a configuration, the risk of problems related to power supply occurring can be reduced by disposing a memory chip having relatively low power consumption as the upper chip. However, from now on three dimensional packaging will be needed for high performance semiconductor chips including arithmetic circuits, such as cores, in order to improve performance of semiconductor devices.

In order to address this, a configuration in which plural through-silicon vias are arranged uniformly across the entire surface of the lower chip might be considered. Although such a configuration is considered optimal from the viewpoint of power source supply to the upper chip, a need arises to arrange circuit elements in the lower chip within respective circuit blocks while avoiding the through-silicon vias, leading to an increase in chip surface area, an increase in wiring, an increase in power consumption due to an increase in repeater cells, and a decrease in performance. Namely, configurations in which plural through-silicon vias are arranged uniformly across the entire surface of the lower chip are not considered configurations suited to three dimensional packaging of semiconductor chips having relatively high power consumption and high performance.

A configuration in which plural through-silicon vias are arranged at the outer periphery of the lower chip might also be considered. The problems described above do not arise in such a configuration, since the need to arrange circuit elements to avoid the through-silicon vias in the lower chip does not arise. However, when through-silicon vias are arranged at the outer periphery of the lower chip, voltage drop toward the center of the upper chip increases, and power source voltage decreases at the upper chip center. This gives rise to, for example, delays in clock signals in circuit blocks arranged at the center of the upper chip, and the circuit may sometimes malfunction.

Explanation follows regarding an exemplary embodiment of technology disclosed herein, with reference to the drawings. Identical or equivalent configuration elements in each of the drawings are allocated the same reference numerals, and redundant explanation thereof is omitted as appropriate.

First Exemplary Embodiment

Figure 2:
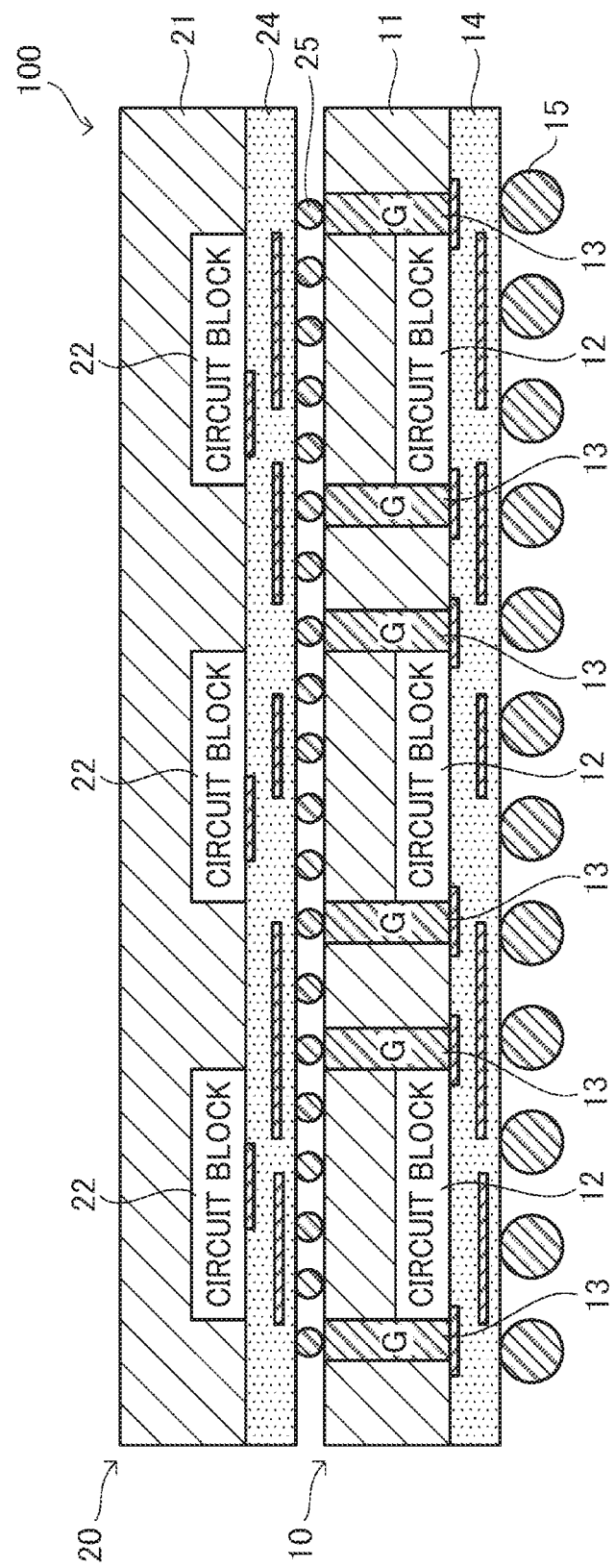
FIG. 2 is a cross-section of a semiconductor device according to the first exemplary embodiment of technology disclosed herein.

FIG. 1 is a plan view of a first semiconductor chip 10 configuring a semiconductor device according to a first exemplary embodiment of technology disclosed herein. FIG. 2 is a cross-section of a semiconductor device 100 according to the present exemplary embodiment of technology disclosed herein, including the first semiconductor chip 10 and a second semiconductor chip 20 stacked on the first semiconductor chip 10. The cross-section illustrated in FIG. 2 corresponds to a cross-section sectioned along the line 2-2 illustrated in FIG. 1.

The first semiconductor chip 10 is configured including a semiconductor substrate 11 formed with plural circuit blocks 12 and plural through-silicon vias 13, a wiring layer 14, and bumps 15. In the present exemplary embodiment, the wiring layer 14 and the bumps 15 are disposed at a side of the semiconductor substrate 11 where a mounting board, not illustrated in the drawings, is present for packaging the first semiconductor chip 10. The first semiconductor chip 10 is electrically and mechanically connected to the mounting board, not illustrated in the drawings, through the bumps 15. The wiring layer 14 may include plural wiring layers stacked with insulator layers interposed therebetween.

The circuit blocks 12 may, for example, configure a high speed, high performance integrated circuit in which power consumption by the cores, the cache memory, and the like is relatively high. The plural through-silicon vias 13 are respectively configured by conductors penetrating through in the thickness direction of the semiconductor substrate 11. One end of each of the through-silicon vias 13 is electrically connected to wiring formed in the wiring layer 14, and the other end of each of the through-silicon vias 13 is exposed to the surface at the side of the semiconductor substrate 11 on which the second semiconductor chip 20 is stacked.

The second semiconductor chip 20 is configured including a semiconductor substrate 21 in which plural circuit blocks 22 are formed, a wiring layer 24, and micro bumps 25. The second semiconductor chip 20 is stacked on the first semiconductor chip 10 in what is known as a face-to-back scheme, in which the wiring layer 24 faces the back face of the first semiconductor chip 10 (the face on the opposite side to the wiring layer 14). The micro bumps 25 are electrically connected to the through-silicon vias 13 provided at the first semiconductor chip 10. The second semiconductor chip 20 receives a supply of a power source through the through-silicon vias 13. Namely, each connection between the through-silicon vias 13 and the micro bumps 25 is a power source supply point for the second semiconductor chip 20.

As illustrated in FIG. 1, in the first semiconductor chip 10 the plural through-silicon vias 13 are arranged so as to surround the outer periphery of each of the circuit blocks 12. In FIG. 1 and FIG. 2, the letter "V" is appended to through-silicon vias 13 applied with a power source potential, and the letter "G" is appended to through-silicon vias 13 applied with a ground potential. In the present exemplary embodiment, the through-silicon vias 13 applied with the power source potential are alternatingly arranged with the through-silicon vias 13 applied with the ground potential, and applied voltages are assigned to each of the through-silicon vias 13 such that through-silicon vias 13 that face each other across a circuit block 12 are at the same potential.

Figure 3:
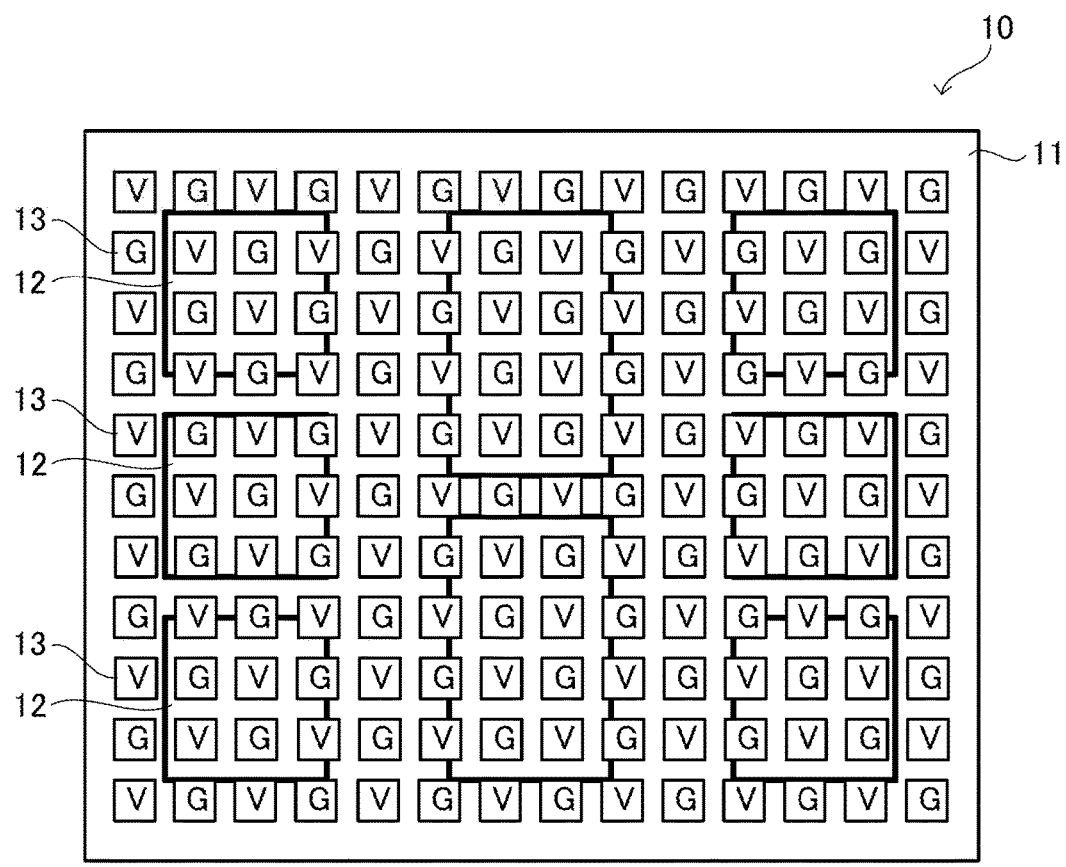
FIG. 3 is a plan view illustrating an arrangement of through-silicon vias in a first semiconductor chip according to a comparative example.
Figure 4:
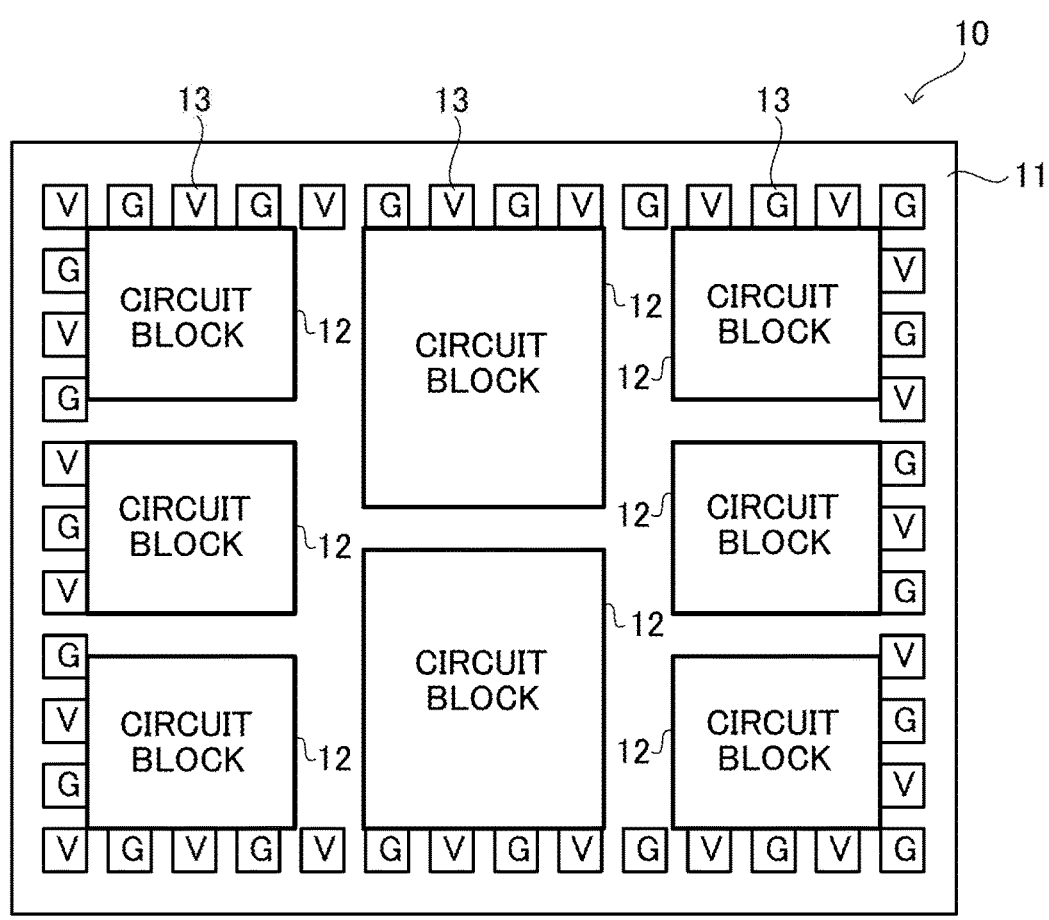
FIG. 4 is a plan view illustrating an arrangement of through-silicon vias in a first semiconductor chip according to a comparative example.

FIG. 3 and FIG. 4 are each plan views illustrating an arrangement of through-silicon vias 13 according to a comparative example. In the example illustrated in FIG. 3, the plural through-silicon vias 13 are arranged across the entire surface of the first semiconductor chip 10 irrespective of the arrangement of the circuit blocks 12. In such a configuration, in the first semiconductor chip 10 a need arises to arrange circuit elements in each of the circuit blocks 12 to avoid the through-silicon vias 13, leading to an increase in chip surface area, an increase in wiring, an increase in power consumption due to an increase in repeater cells, and a decrease in performance. Namely, the arrangement of the through-silicon vias 13 illustrated in FIG. 3 is not considered an arrangement suited to three dimensional packaging of semiconductor chips that include high speed, high performance integrated circuits having relatively high power consumption.

In the example of FIG. 4, the plural through-silicon vias 13 are arranged at the outer periphery of the first semiconductor chip 10. In such a configuration, the problems described above do not arise when the arrangement of the through-silicon vias 13 illustrated in FIG. 3 is applied, since a need to arrange circuit elements to avoid the through-silicon vias 13 does not arise in the first semiconductor chip 10. However, the only power source supply points for the second semiconductor chip 20 are at the chip outer periphery when the through-silicon vias 13 are arranged at the outer periphery of the first semiconductor chip 10. Accordingly, voltage drop toward the center of the second semiconductor chip 20 increases, and power source voltage at the center of the second semiconductor chip 20 decreases. This gives rise to, for example, delays in clock signals in circuit blocks disposed at the center of second semiconductor chip 20, and the circuit may sometimes malfunction.

However, in the first semiconductor chip 10 according to the present exemplary embodiment of technology disclosed in FIG. 1 and FIG. 2, the plural through-silicon vias 13 are arranged to surround the outer periphery of each of the plural circuit blocks 12. In such a configuration, a need to arrange the circuit elements to avoid the through-silicon vias 13 does not arise in the first semiconductor chip 10. This enables highly efficient usage of surface area to be secured when arranging circuit elements and wiring in each of the circuit blocks 12. Accordingly, the problems related to applying the arrangement of the through-silicon vias 13 illustrated in FIG. 3, such as an increase in chip surface area, an increase in wiring, an increase in power consumption due to increased repeater cells, and a performance reduction, do not arise. According to the present exemplary embodiment of technology disclosed in FIG. 1 and FIG. 2, since the plural through-silicon vias 13 are also arranged at the center of the first semiconductor chip 10, the power source can be supplied to the center of the second semiconductor chip 20 through these through-silicon vias 13. Accordingly, problems related to applying the arrangement of the through-silicon vias 13 illustrated in FIG. 4, namely, a reduction in the power source voltage at the center of the second semiconductor chip 20, can also be eliminated.

Thus, in the semiconductor device 100 according to the present exemplary embodiment of technology disclosed herein, voltage drop can be suppressed while suppressing performance reduction when a power source is supplied between three dimensionally packaged semiconductor chips. Accordingly, technology disclosed herein can also be applied to three dimensional packaging of high performance semiconductor chips that include arithmetic circuits, such as cores.

Moreover, in the semiconductor device 100 according to the present exemplary embodiment, through-silicon vias 13 applied with the power source potential are alternatingly arranged with the through-silicon vias 13 applied with the ground potential. This simplifies routing of power source wiring (not illustrated in the drawings) and ground wiring (not illustrated in the drawings) formed in the wiring layer 24 in the second semiconductor chip 20, and enables the wiring lengths of the power source wiring and the ground wiring to be made shorter, compared to cases in which the above described alternating arrangement is not applied.

Second Exemplary Embodiment

FIG. 5 is a cross-section illustrating a configuration of a semiconductor device 101 according to a second exemplary embodiment of technology disclosed herein, configured by further stacking a third semiconductor chip 30 on a second semiconductor chip 20A stacked on the first semiconductor chip 10. The second semiconductor chip 20A includes plural through-silicon vias 23 for supplying a power source to the third semiconductor chip 30. Similarly to in the first semiconductor chip 10, the plural through-silicon vias 23 are arranged so as to surround the outer periphery of each of the circuit blocks 22. The plural through-silicon vias 23 are respectively electrically connected to the through-silicon vias 13 provided at the first semiconductor chip 10.

The third semiconductor chip 30 is configured including a semiconductor substrate 31 formed with plural circuit blocks 32, a wiring layer 34, and micro bumps 35. The third semiconductor chip 30 is stacked on the second semiconductor chip 20A in what is known as a face-to-back scheme, in which the wiring layer 34 faces the back face of the second semiconductor chip 20A (the face on the opposite side to the wiring layer 24). The micro bumps 35 are electrically connected to the through-silicon vias 23 provided at the second semiconductor chip 20A. The third semiconductor chip 30 receives a supply of a power source through the through-silicon vias 23. Namely, each connection between the through-silicon vias 23 and the micro bumps 35 is a power source supply point for the third semiconductor chip 30.

The arrangement of the circuit blocks 12, 23 and the through-silicon vias 13, 23 of the first semiconductor chip 10 and the second semiconductor chip 20A may be aligned with each other. This enables the through-silicon vias 13 and the through-silicon vias 23 to be linked together via the shortest route, and is favorable in three dimensional packaging in which three or more semiconductor chips are stacked.

Figure 6A:
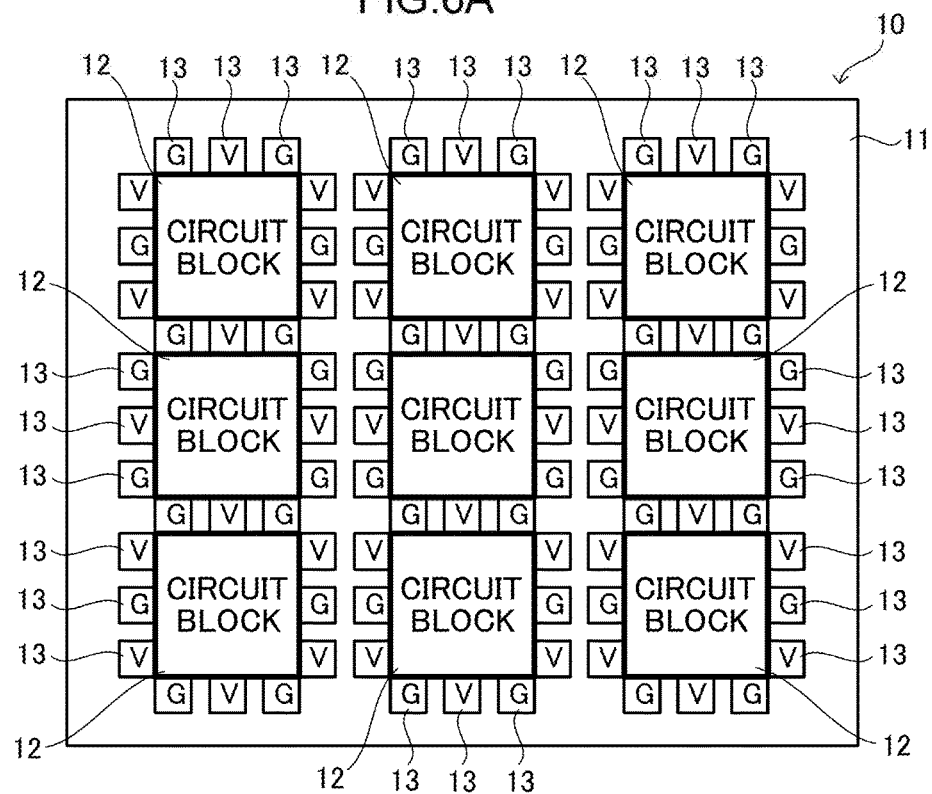
FIG. 6A is a plan view of a first semiconductor chip according to an exemplary embodiment of technology disclosed herein.
Figure 6B:
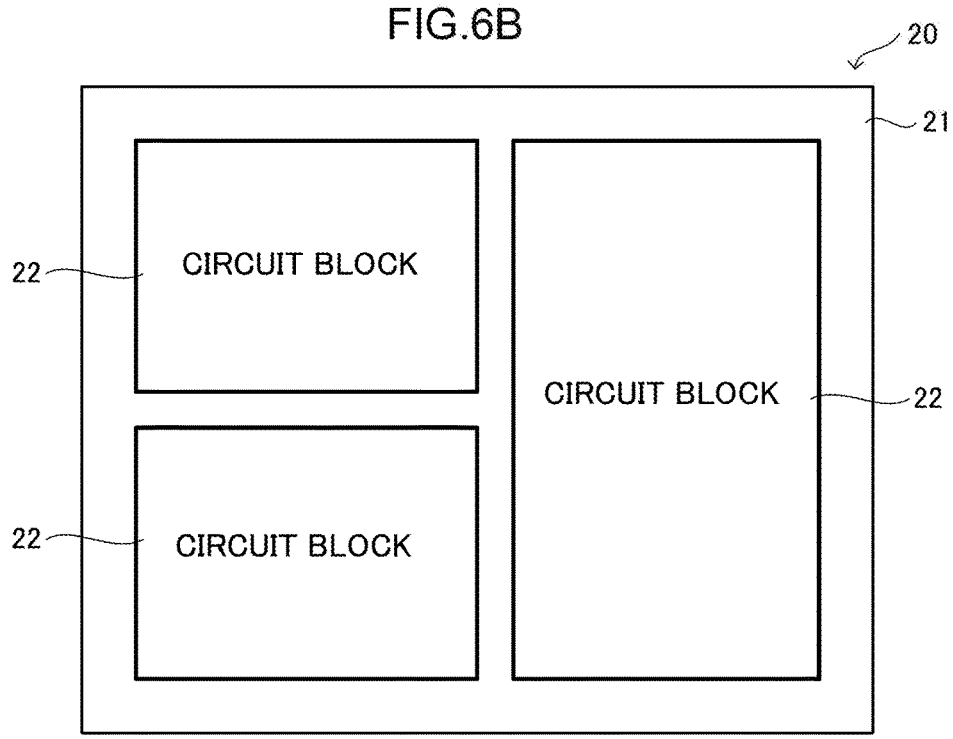
FIG. 6B is a plan view of a first semiconductor chip according to an exemplary embodiment of technology disclosed herein.

As illustrated in FIG. 6B, a second semiconductor chip 20, including plural circuit blocks 22 with sizes and arrangement that differ from those of the plural circuit blocks 12 provided on the first semiconductor chip 10, can also be stacked on the first semiconductor chip 10 illustrated in FIG. 6A. In such cases, the size of each of the circuit blocks 12 is preferably made as small as possible in the first semiconductor chip 10 such that regions do not arise where the formation density of the through-silicon vias 13 is low. Moreover, the size of each of the circuit blocks 12 is preferably uniform, and the circuit blocks 12 are preferably arranged at uniform spacing, such that unevenness in the formation density of the through-silicon vias 13 is reduced.

Figure 7:
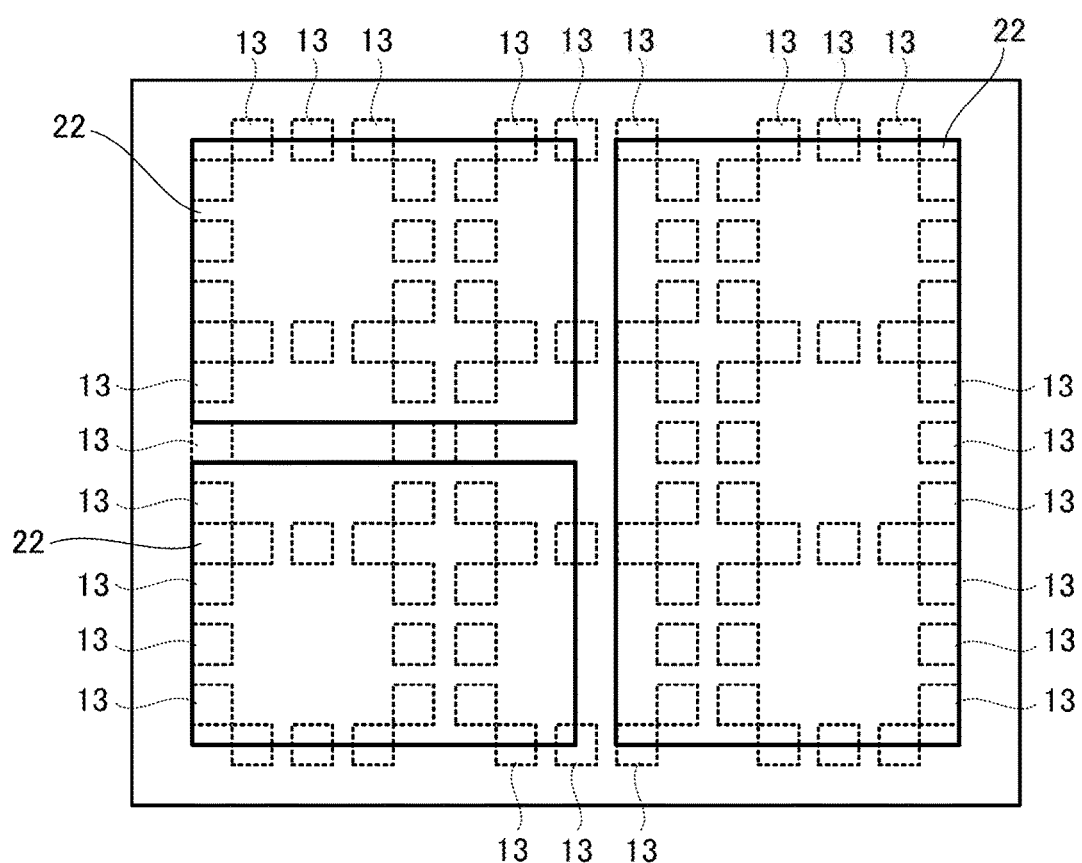
FIG. 7 is a diagram illustrating relative positions of circuit blocks and through-silicon vias when a first semiconductor chip and a second semiconductor chip are stacked according to an exemplary embodiment of technology disclosed herein.

FIG. 7 is a diagram illustrating relative positions of the circuit blocks 22 and the through-silicon vias 13 in a case in which the second semiconductor chip 20 illustrated in FIG. 6B has been stacked on the first semiconductor chip 10 illustrated in FIG. 6A. In the first semiconductor chip 10, the size of each of the circuit blocks 12 is made small scale and uniform, and the circuit blocks 12 are arranged at uniform spacing, thereby suppressing voltage drop in the supply of the power source to each of the circuit blocks 22 of the second semiconductor chip 20 through the through-silicon vias 13.

Third Exemplary Embodiment

Figure 8:
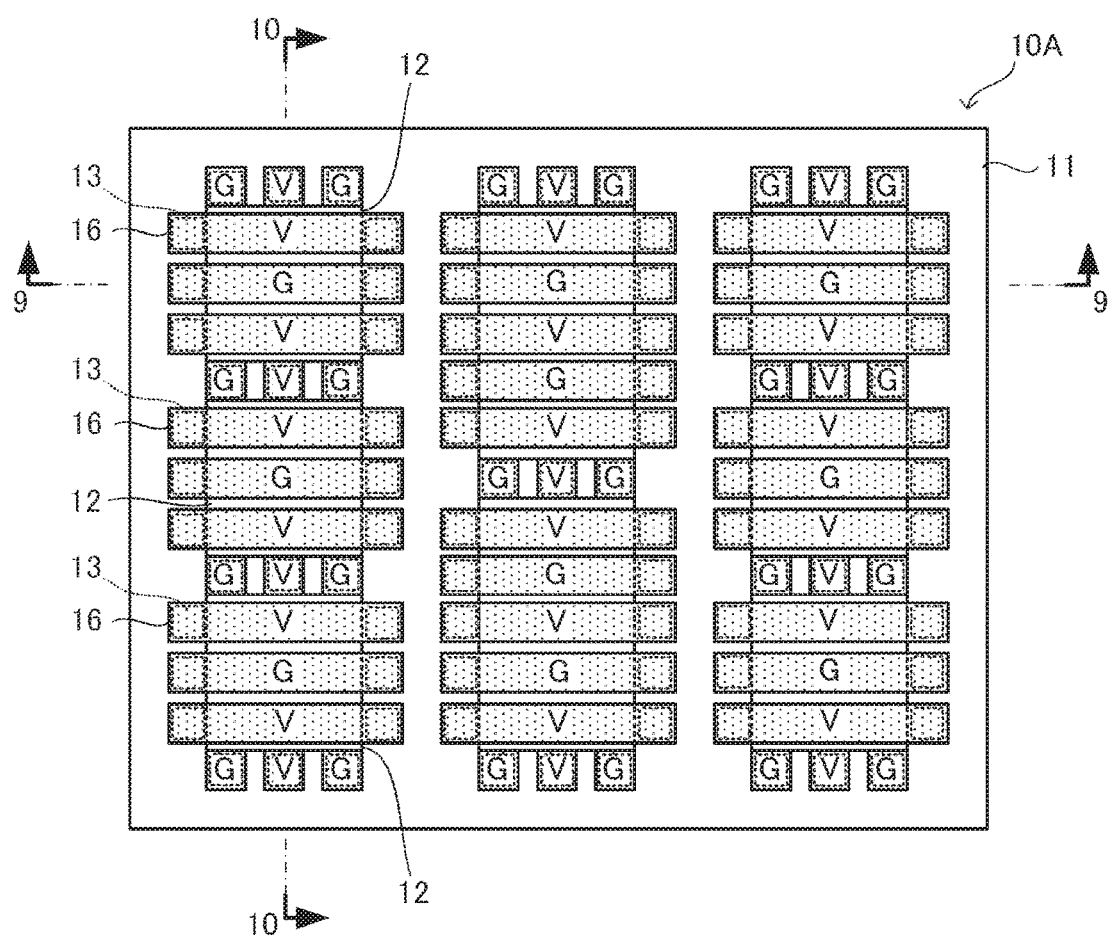
FIG. 8 is a plan view of a first semiconductor chip according to a third exemplary embodiment of technology disclosed herein.
Figure 9:
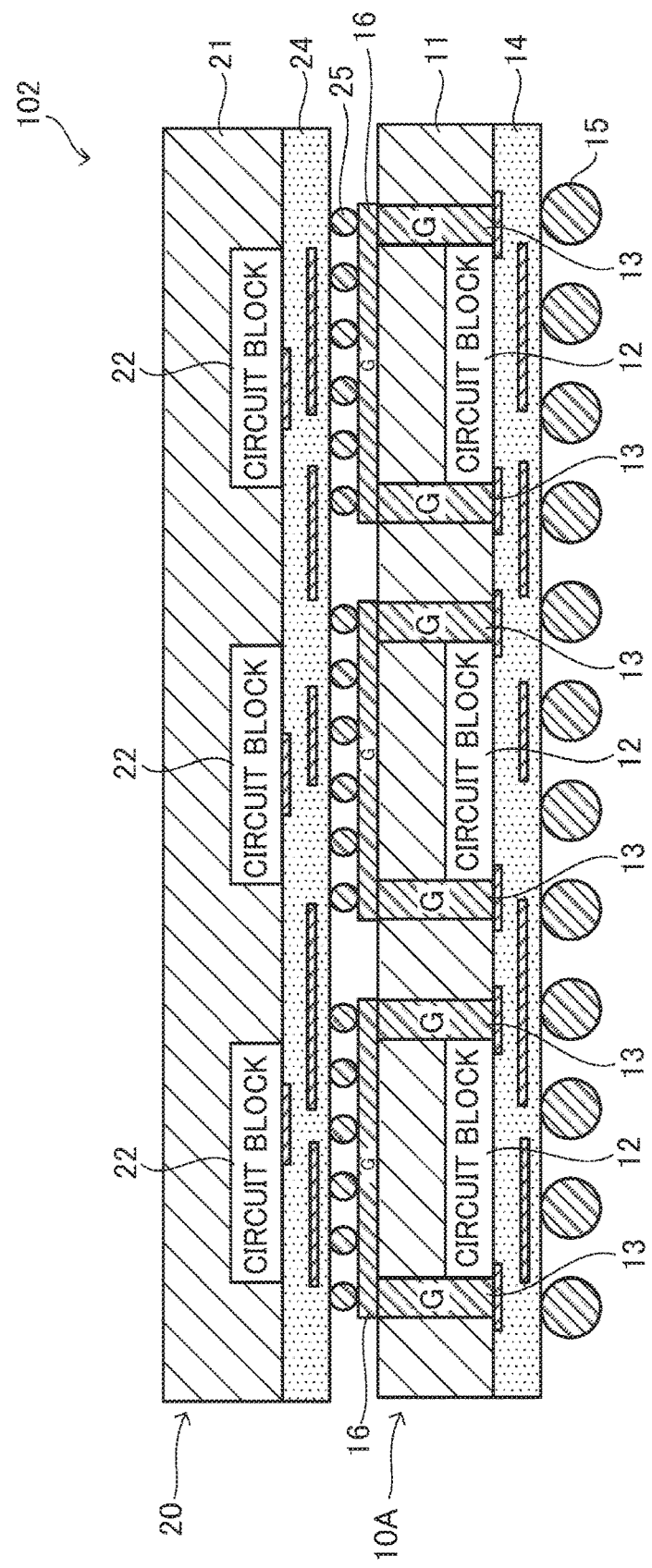
FIG. 9 is a cross-section of a semiconductor device according to the third exemplary embodiment of technology disclosed herein.
Figure 10:
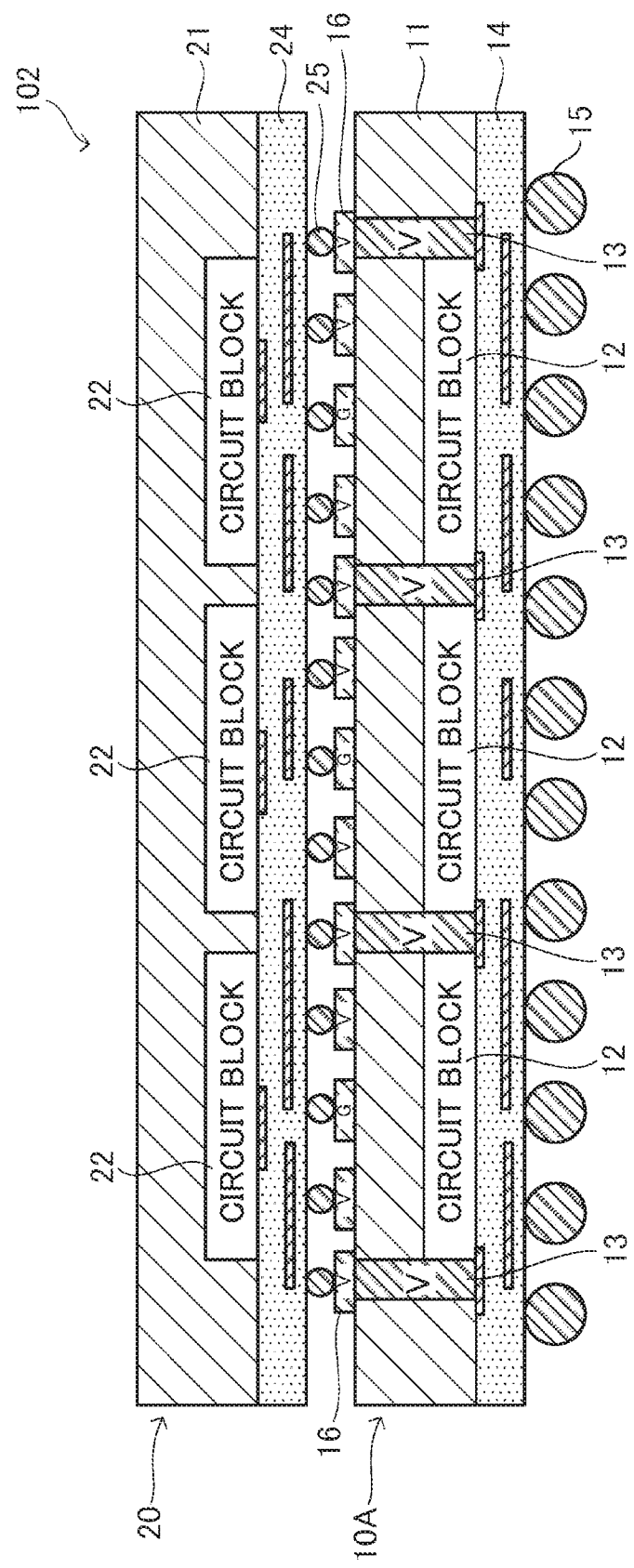
FIG. 10 is a cross-section of a semiconductor device according to the third exemplary embodiment of technology disclosed herein.

FIG. 8 is a plan view of a first semiconductor chip 10A configuring a semiconductor device according to a third exemplary embodiment of technology disclosed herein. FIG. 9 and FIG. 10 are cross-sections of a semiconductor device 102 according to the third exemplary embodiment of technology disclosed herein, including the first semiconductor chip 10A, and the second semiconductor chip 20 stacked on the first semiconductor chip 10A. Note that the cross-section illustrated in FIG. 9 corresponds to a cross-section sectioned along line 9-9 in FIG. 8, and the cross-section illustrated in FIG. 10 corresponds to a cross-section sectioned along line 10-10 illustrated in FIG. 8.

Similarly to in the first semiconductor chip 10 according to the first exemplary embodiment, in the semiconductor device 102 according to the third exemplary embodiment, the first semiconductor chip 10A includes plural through-silicon vias 13 arranged so as to surround the outer periphery of each of the plural circuit blocks 12 (see FIG. 1). The first semiconductor chip 10A further includes the redistribution layer (RDL) 16 electrically connected to the through-silicon vias 13, on the face of the semiconductor substrate 11 at the side on which the second semiconductor chip 20 is stacked.

The wiring of the redistribution layer 16 are arranged such that through-silicon vias 13 at the same potential disposed facing each other across a circuit block 12 are linked, and the plural wiring of the redistribution layer 16 extend along the same direction as one another so as to cross over the respective circuit blocks 12. In FIGS. 8 to 10, the letter "V" is appended to through-silicon vias 13 and the wiring of the redistribution layer 16 applied with the power source potential, and the letter "G" is appended to through-silicon vias 13 and the wiring of the redistribution layer 16 applied with the ground potential. In first semiconductor chip 10A, the through-silicon vias 13 applied with the power source potential are alternatingly arranged with the through-silicon vias 13 applied with the ground potential. The wiring of the redistribution layer 16 applied with the power source potential are thereby alternatingly arranged with the wiring of the redistribution layer 16 applied with the ground potential.

The second semiconductor chip 20 is stacked on the first semiconductor chip 10A in what is known as a face-to-back scheme, in which the wiring layer 24 faces the back face of the first semiconductor chip 10A (the face on the opposite side to the wiring layer 14). The micro bumps 25 are connected to the redistribution layer 16 provided at the first semiconductor chip 10A, and are electrically connected to the through-silicon vias 13 through the redistribution layer 16. The second semiconductor chip 20 receives a supply of a power source through the through-silicon vias 13 and the redistribution layer 16. Namely, each connection point between the redistribution layer 16 and the micro bumps 25 is a power source supply point for the second semiconductor chip 20.

In the semiconductor device 102 according to the third exemplary embodiment, due to the redistribution layer 16 being provided at the first semiconductor chip 10A, power source supply points for the second semiconductor chip 20 can be increased, compared to cases lacking the redistribution layer 16. Moreover, the wiring of the redistribution layer 16 are connected in parallel to the power source wiring (not illustrated in the drawings) and the ground wiring (not illustrated in the drawings) formed in the wiring layer 24 of the second semiconductor chip 20. This enables voltage drop in the power source supply route to be suppressed, compared to cases lacking the redistribution layer 16. Namely, in the semiconductor device 102 according to the third exemplary embodiment, the power source supply network between the first semiconductor chip 10A and the second semiconductor chip 20 can be reinforced.

In the first semiconductor chip 10A, the wiring of the redistribution layer 16 applied with the power source potential are alternatingly arranged with the wiring of the redistribution layer 16 applied with the ground potential. This simplifies routing of power source wiring (not illustrated in the drawings) and ground wiring (not illustrated in the drawings) formed in the wiring layer 24 in the second semiconductor chip 20, and enables the wiring lengths of the power source wiring and the ground wiring to be made shorter, compared to cases in which the above described alternating arrangement is not applied.

The width and thickness of the redistribution layer 16 are preferably made as large as possible from the viewpoint of reducing the wiring resistance of the wiring of the redistribution layer 16 and suppressing voltage drop in the power source supply route between the first semiconductor chip 10A and the second semiconductor chip 20.

Fourth Exemplary Embodiment

Figure 11:
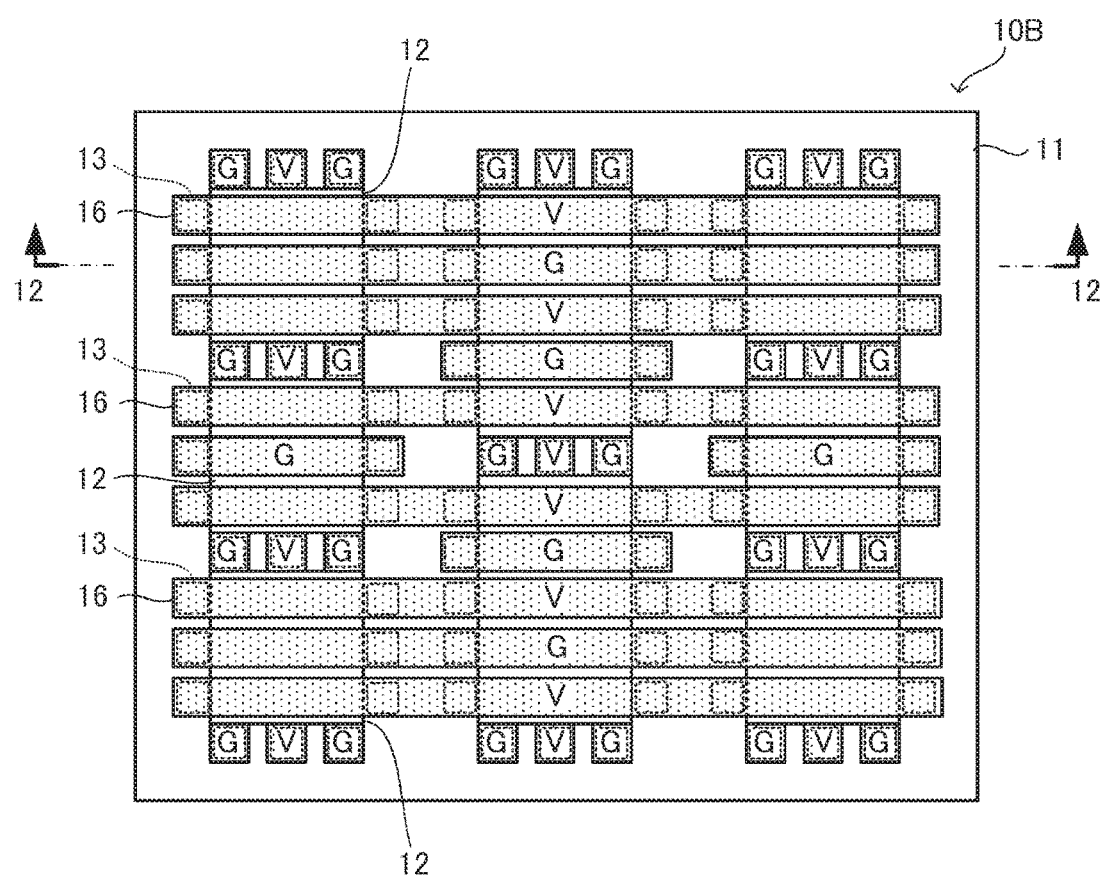
FIG. 11 is a plan view of a first semiconductor chip according to a fourth exemplary embodiment of technology disclosed herein.
Figure 12:
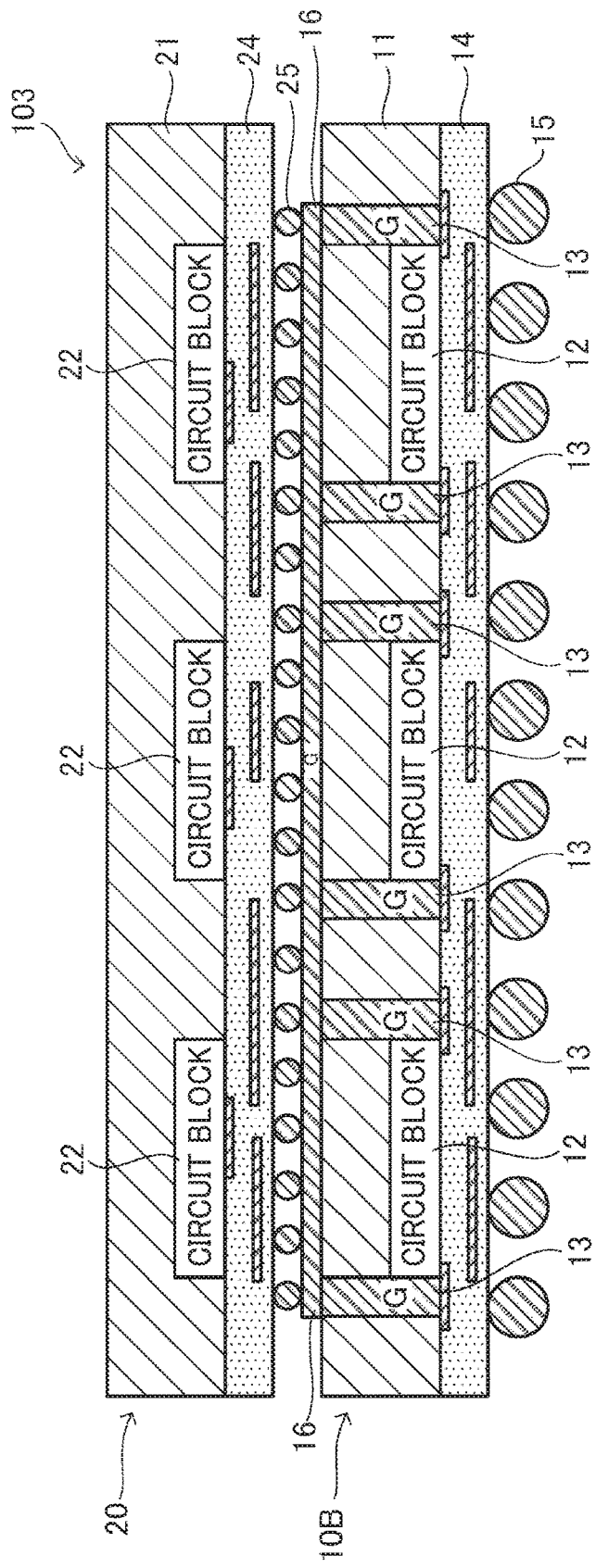
FIG. 12 is a cross-section of a semiconductor device according to the fourth exemplary embodiment of technology disclosed herein.

FIG. 11 is a plan view of a first semiconductor chip 10B configuring a semiconductor device according to a fourth exemplary embodiment of technology disclosed herein. FIG. 12 is a cross-section of a semiconductor device 103 according to the fourth exemplary embodiment of technology disclosed herein, including the first semiconductor chip 10B, and the second semiconductor chip 20 stacked on the first semiconductor chip 10B. Note that the cross-section illustrated in FIG. 12 corresponds to a cross-section sectioned along line 12-12 illustrated in FIG. 11.

Similarly to in the first semiconductor chip 10 according to the first exemplary embodiment, in the semiconductor device 103 according to the fourth exemplary embodiment, the first semiconductor chip 10B includes plural through-silicon vias 13 arranged so as to surround the outer periphery of each of the plural circuit blocks 12 (see FIG. 1). Moreover, similarly to the first semiconductor chip 10A according to the third exemplary embodiment described above, the first semiconductor chip 10B includes the redistribution layer 16 on the surface of the semiconductor substrate 11 at the side stacked with the second semiconductor chip 20, electrically connected to the through-silicon vias 13.

In the first semiconductor chip 10A according to the third exemplary embodiment, the wiring of the redistribution layer 16 are separate for each of the circuit blocks 12, as illustrated in FIG. 8. In contrast, as illustrated in FIG. 11, in the first semiconductor chip 10B according to the fourth exemplary embodiment, each of the wiring of the redistribution layer 16 extends in a straight line from one end side of the first semiconductor chip 10B toward another end side so as to straddle plural circuit blocks 12. The wiring of the redistribution layer 16 are arranged such that through-silicon vias 13 at the same potential disposed facing each other across the circuit blocks 12 are linked together, and the wiring of the redistribution layer 16 extend in the same direction as one another. In FIG. 11 and FIG. 12, the letter "V" is appended to through-silicon vias 13 and the wiring of the redistribution layer 16 applied with the power source potential, and the letter "G" is appended to through-silicon vias 13 and the wiring of the redistribution layer 16 applied with the ground potential. In first semiconductor chip 10B, the through-silicon vias 13 applied with the power source potential are alternatingly arranged with the through-silicon vias 13 applied with the ground potential. The wiring of the redistribution layer 16 applied with the power source potential are thereby alternatingly arranged with the wiring of the redistribution layer 16 applied with the ground potential.

The second semiconductor chip 20 is stacked on the first semiconductor chip 10B in what is known as a face-to-back scheme, in which the wiring layer 24 faces the back face of the first semiconductor chip 10B (the face on the opposite side to the wiring layer 14). The micro bumps 25 are connected to the redistribution layer 16 provided at the first semiconductor chip 10B, and are electrically connected, through the redistribution layer 16, to the through-silicon vias 13. The second semiconductor chip 20 receives a supply of a power source through the through-silicon vias 13 and the redistribution layer 16. Namely, each connection point between the redistribution layer 16 and the micro bumps 25 is a power source supply point for the second semiconductor chip 20.

As described above, each of the wiring of the redistribution layer 16 extends in a straight line from one end side toward another end side of the first semiconductor chip 10B, so as to straddle plural circuit blocks 12 in the semiconductor device 103 according to the fourth exemplary embodiment. This enables the power source potential and the ground potential applied to the wiring of the redistribution layer 16 to be stabilized, in contrast to configurations in which the wiring of the redistribution layer 16 are separate for each of the circuit blocks 12 (see FIG. 8). Moreover, since the power source supply points for the second semiconductor chip 20 can be increased, the current capacity of the power source supply route can be increased compared to configurations in which the wiring of the redistribution layer 16 are separate for each of the circuit blocks 12.

Fifth Exemplary Embodiment

Figure 13:
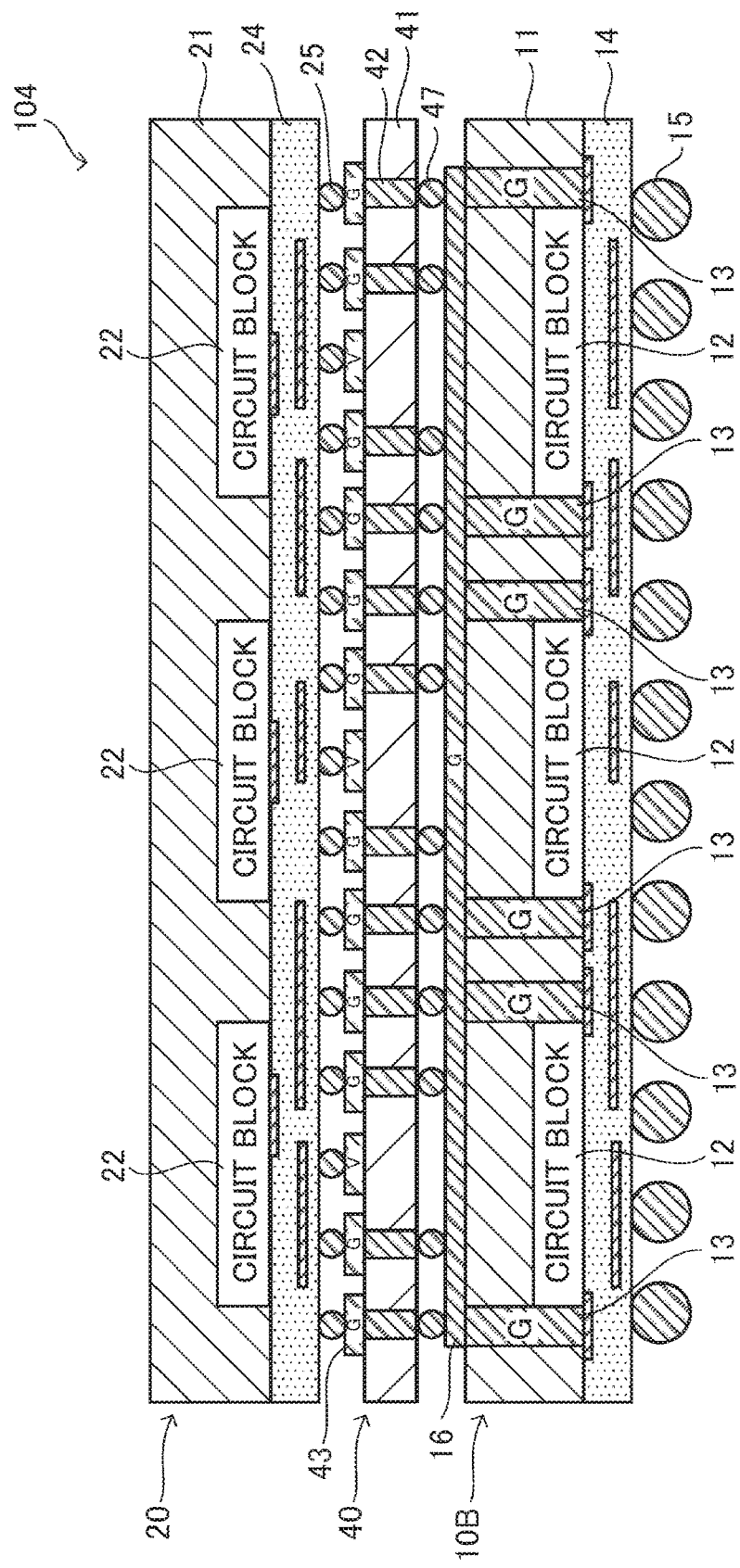
FIG. 13 is a cross-section of a semiconductor device according to a fifth exemplary embodiment of technology disclosed herein.
Figure 14:
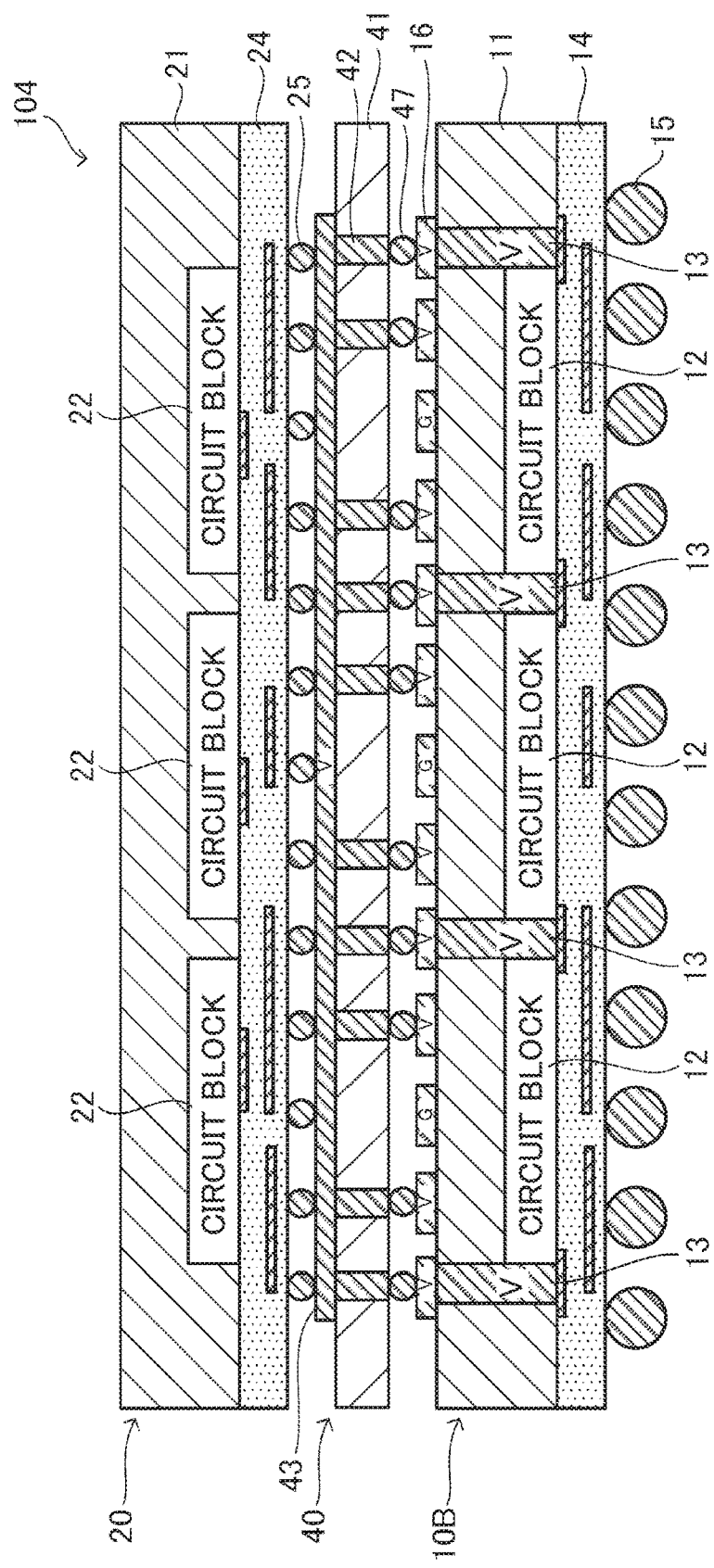
FIG. 14 is a cross-section of a semiconductor device according to the fifth exemplary embodiment of technology disclosed herein.
Figure 15:
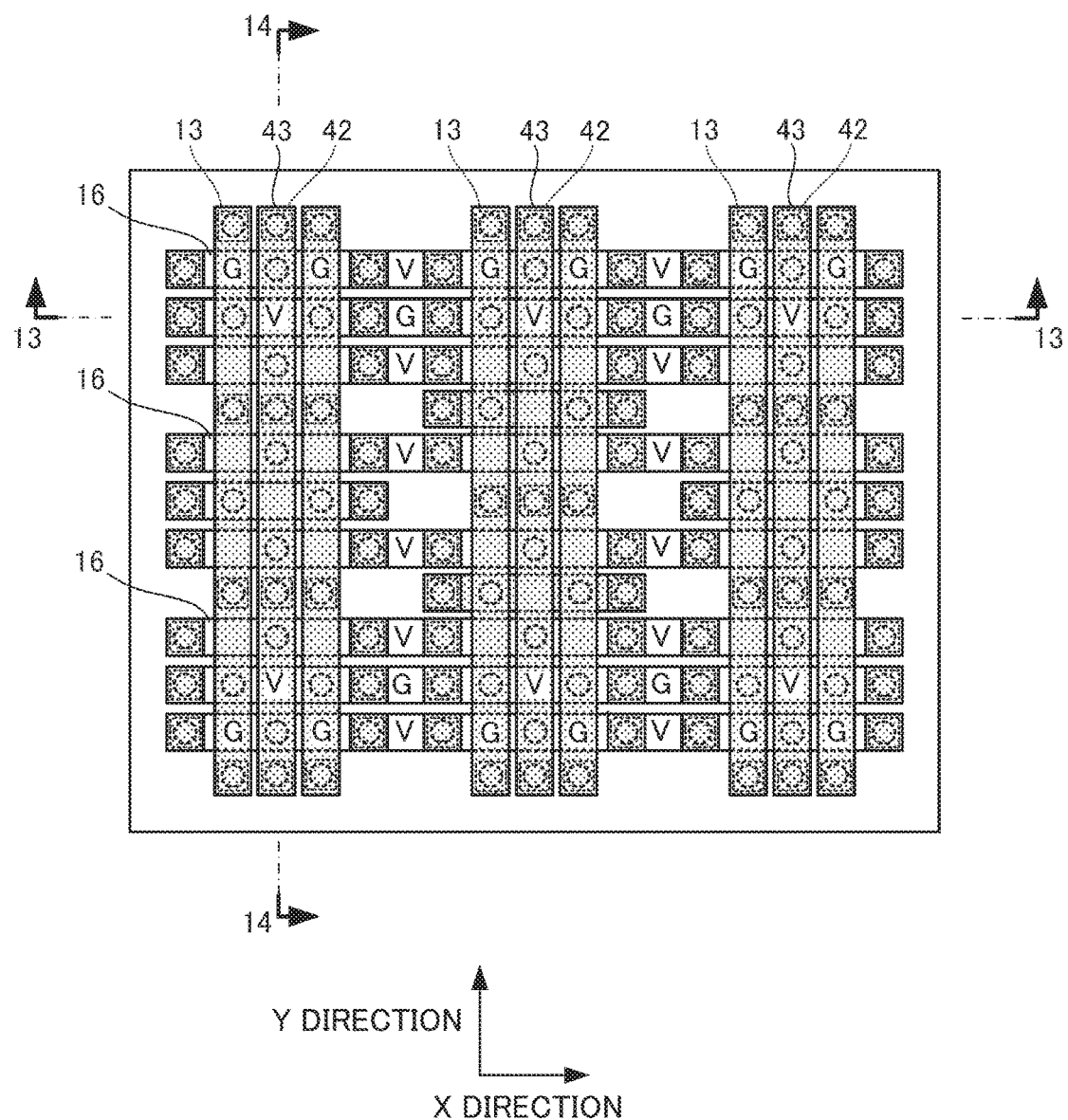
FIG. 15 is a plan view illustrating a configuration of a power source supply network of a semiconductor device according to the fifth exemplary embodiment of technology disclosed herein.

FIG. 13 and FIG. 14 are cross-sections of a semiconductor device 104 according to the fifth exemplary embodiment of technology disclosed herein. FIG. 15 is a plan view illustrating a configuration of a power source supply network in the semiconductor device 104. Note that the cross-section illustrated in FIG. 13 corresponds to a cross-section sectioned along line 13-13 in FIG. 15, and the cross-section illustrated in FIG. 14 corresponds to a cross-section sectioned along line 14-14 illustrated in FIG. 15.

Similarly to in the first semiconductor chip 10 according to the first exemplary embodiment, in the semiconductor device 104 according to a fifth exemplary embodiment, the first semiconductor chip 10B includes plural through-silicon vias 13 arranged so as to surround the outer periphery of each of the plural circuit blocks 12 (see FIG. 1). The first semiconductor chip 10B further includes the redistribution layer 16 similarly to the first semiconductor chip 10B according to the fourth exemplary embodiment (see FIG. 11). The semiconductor device 104 further includes a silicon interposer 40 provided between the first semiconductor chip 10B and the second semiconductor chip 20. The silicon interposer 40 functions as a relay board that relays the power source supply between the first semiconductor chip 10B and the second semiconductor chip 20.

The silicon interposer 40 includes a silicon substrate 41, plural micro bumps 47 connected to the redistribution layer 16, plural vias 42 that are respectively connected to the micro bumps 47 and that penetrate the silicon substrate 41, and plural relay lines 43 provided at a front face of the silicon substrate 41. Namely, the relay lines 43 are respectively electrically connected to the through-silicon vias 13 provided at the first semiconductor chip 10B, through the vias 42, the micro bumps 47, and the redistribution layer 16.

FIG. 15 illustrates an arrangement relationship and a connection relationship between the redistribution layer 16 and the relay lines 43. Each of the wiring of the redistribution layer 16 extends in the X direction in FIG. 15. Each of the relay lines 43 extends in the Y direction in FIG. 15, which is orthogonal to the X direction. Namely, the relay lines 43 are arranged so as to respectively intersect the wiring of the redistribution layer 16. Each of the relay lines 43 extends in a straight line from one end side toward another end side of the first semiconductor chip 10B and the second semiconductor chip 20.

In FIGS. 13 to 15, the letter "V" is appended to through-silicon vias 13, the wiring of the redistribution layer 16, and relay lines 43 applied with the power source potential, and the letter "G" is appended to through-silicon vias 13, the wiring of the redistribution layer 16, and relay lines 43 applied with the ground potential. In the first semiconductor chip 10B, the wiring of the redistribution layer 16 applied with the power source potential are alternatingly arranged with the wiring of the redistribution layer 16 applied with the ground potential. Moreover, the arrangements of the vias 42 and the micro bumps 47 in the silicon interposer 40 are determined such that the relay lines 43 applied with the power source potential are alternatingly arranged with the relay lines 43 applied with the ground potential. The relay lines 43 applied with the power source potential are respectively electrically connected to the plural wiring of the redistribution layer 16 applied with the power source potential, through the vias 42 and the micro bumps 47. Similarly, the relay lines 43 applied with the ground potential are respectively electrically connected to the plural wiring of the redistribution layer 16 applied with the ground potential, through the vias 42 and the micro bumps 47.

The micro bumps 25 of the second semiconductor chip 20 are connected to the relay lines 43. Namely, the second semiconductor chip 20 is electrically connected to the through-silicon vias 13 provided at the first semiconductor chip 10B, through the relay lines 43 and the redistribution layer 16. The second semiconductor chip 20 receives a supply of the power source through the through-silicon vias 13, the redistribution layer 16, and the relay lines 43. Each connection point between the relay lines 43 and the micro bumps 25 is a power source supply point for the second semiconductor chip 20.

In the semiconductor device 104 according to the fifth exemplary embodiment, a mesh patterned power source supply network is configured by the plural wiring of the redistribution layer 16 provided at the first semiconductor chip 10B, and the plural relay lines 43 provided at the silicon interposer 40. Namely, the plural wiring of the redistribution layer 16 applied with the same potential are connected in parallel by the plural relay lines 43, enabling voltage drop in the power source supply route to be further suppressed, compared to cases lacking the relay lines 43. Namely, in the semiconductor device 104 according to the fifth exemplary embodiment, the power source supply network between the first semiconductor chip 10B and the second semiconductor chip 20 can be further reinforced.

Moreover, the relay lines 43 applied with the power source potential are alternatingly arranged with the relay lines 43 applied with the ground potential in the silicon interposer 40. This simplifies routing of power source wiring (not illustrated in the drawings) and ground wiring (not illustrated in the drawings) formed in the wiring layer 24 in the second semiconductor chip 20, and enables the wiring lengths of the power source wiring and the ground wiring to be made shorter, compared to cases in which the above described alternating arrangement is not applied.

Note that although an example has been given of a case in which the silicon interposer 40 having the relay lines 43 formed on the silicon substrate 41 is employed as the relay board in the present exemplary embodiment, a relay board may also be employed in which the relay lines 43 are formed on a printed wiring board.

Sixth Exemplary Embodiment

Figure 16:
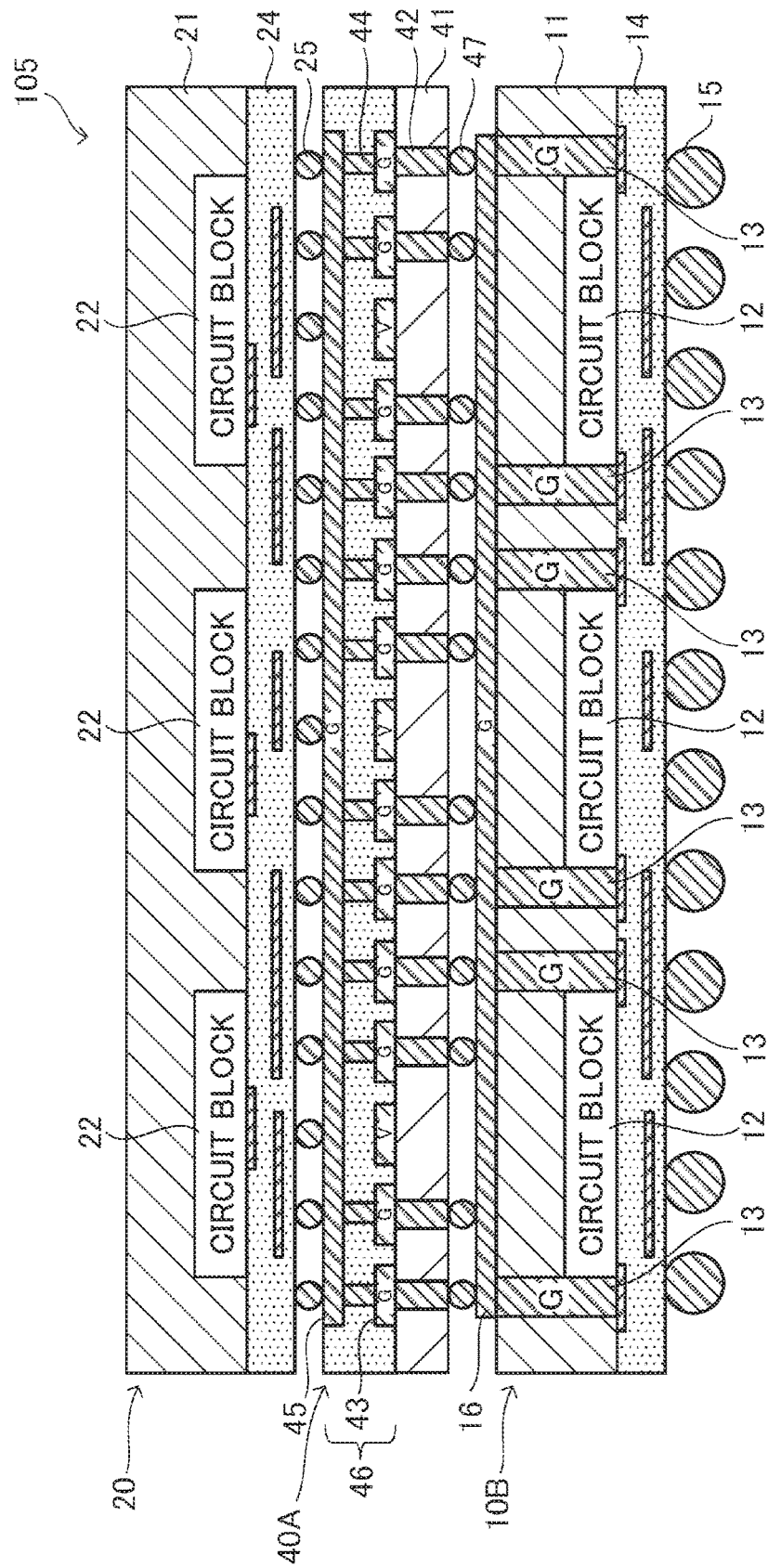
FIG. 16 is a cross-section of a semiconductor device according to a sixth exemplary embodiment of technology disclosed herein.
Figure 17:
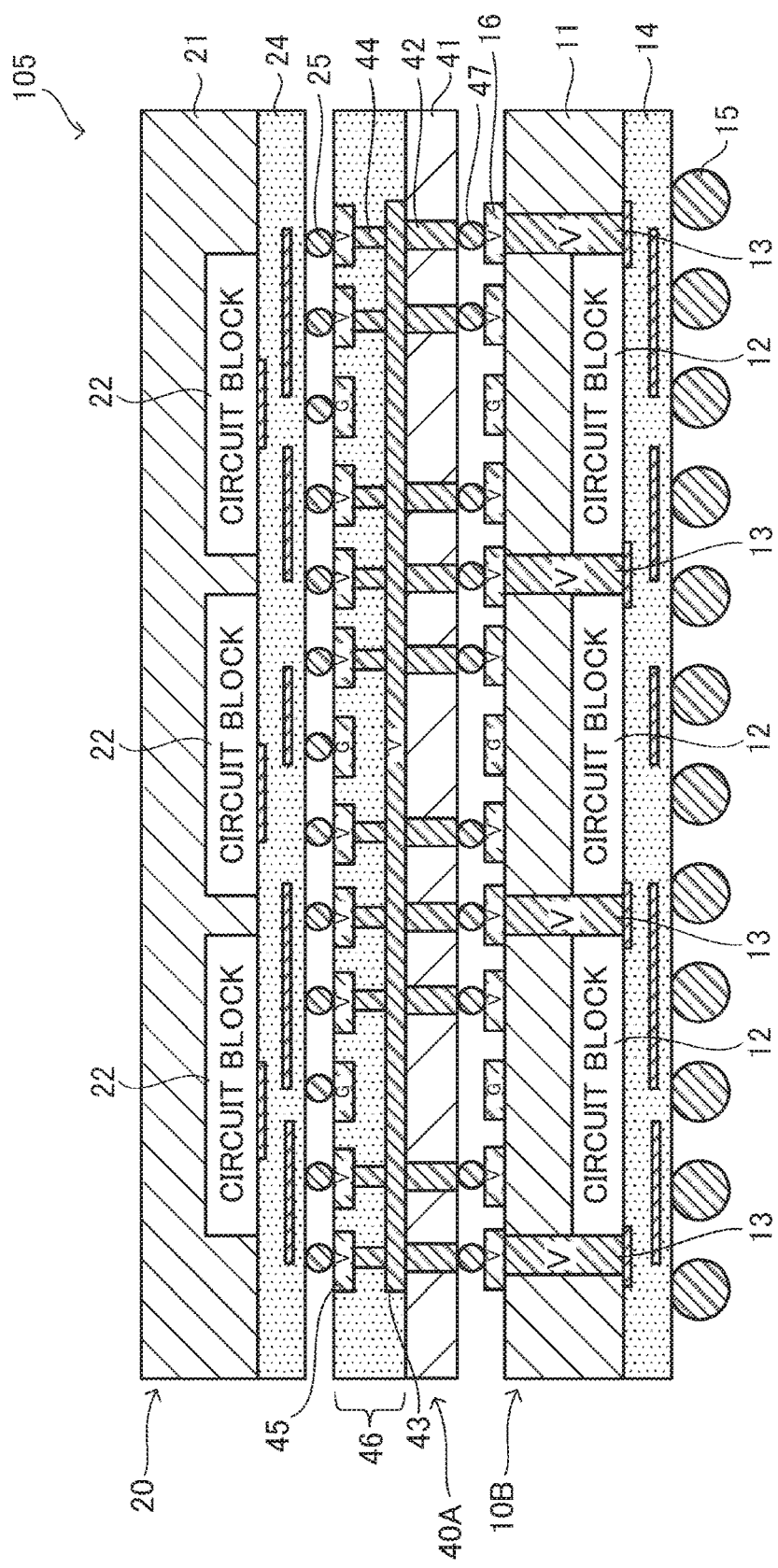
FIG. 17 is a cross-section of a semiconductor device according to the sixth exemplary embodiment of technology disclosed herein.
Figure 18:
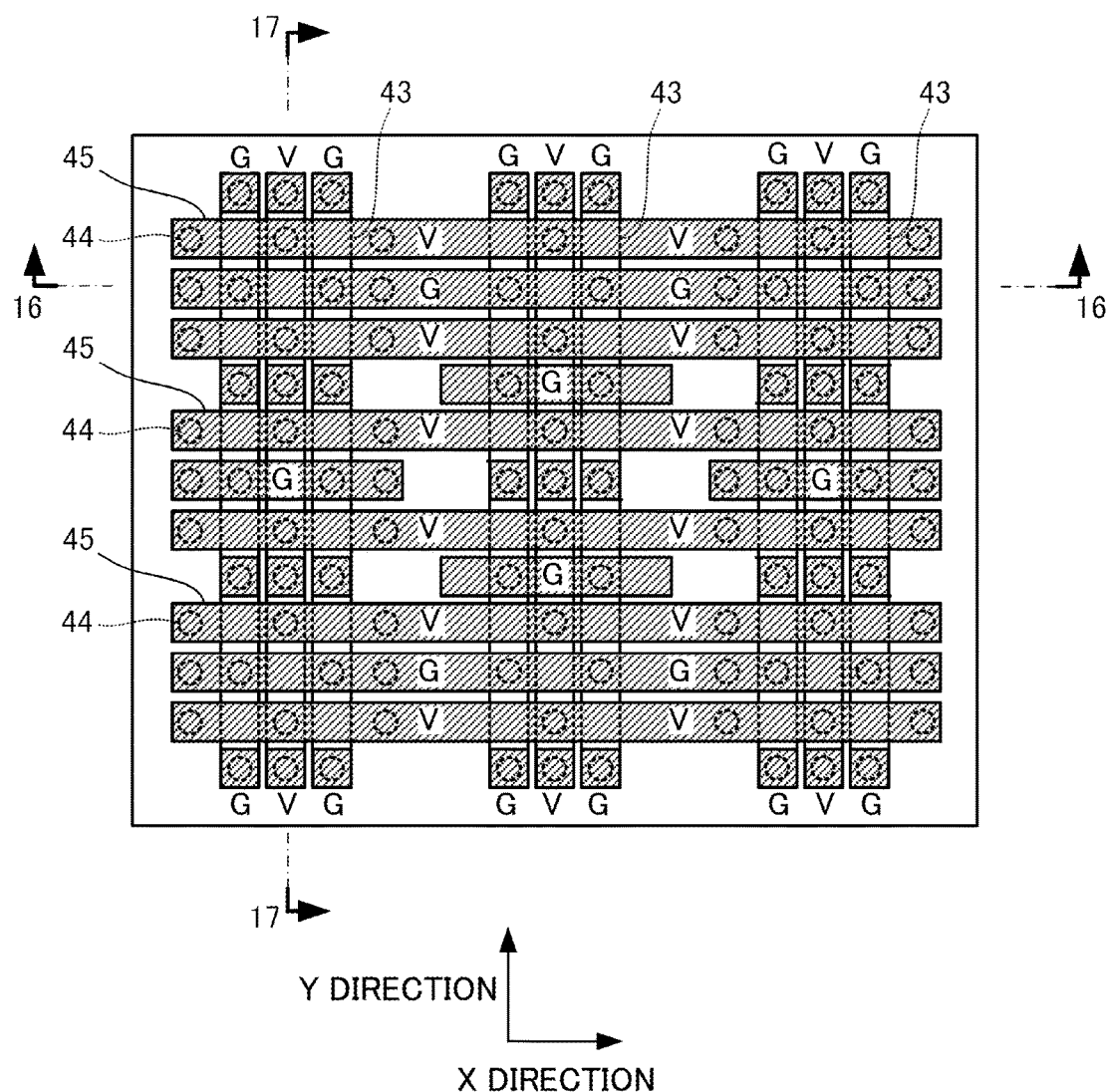
FIG. 18 is a plan view illustrating a configuration of a power source supply network of a semiconductor device according to the sixth exemplary embodiment of technology disclosed herein.

FIG. 16 and FIG. 17 are cross-sections of a semiconductor device 105 according to a sixth exemplary embodiment of technology disclosed herein. FIG. 18 is a plan view illustrating a configuration of a power source supply network in the semiconductor device 105. Note that the cross-section illustrated in FIG. 16 corresponds to a cross-section sectioned along line 16-16 in FIG. 18, and the cross-section illustrated in FIG. 17 corresponds to a cross-section sectioned along line 17-17 illustrated in FIG. 18.

Similarly to in the first semiconductor chip 10 according to the first exemplary embodiment, in the semiconductor device 105 according to the sixth exemplary embodiment, the first semiconductor chip 10B includes plural through-silicon vias 13 arranged so as to surround the outer periphery of each of the plural circuit blocks 12 (see FIG. 1). The first semiconductor chip 10B also includes the redistribution layer 16, similarly to the first semiconductor chip 10B according to the fourth exemplary embodiment (see FIG. 11). The semiconductor device 105 includes a silicon interposer 40A provided between the first semiconductor chip 10B and the second semiconductor chip 20.

The silicon interposer 40A according to the sixth exemplary embodiment includes the silicon substrate 41, the plural micro bumps 47 connected to the redistribution layer 16, and the plural vias 42 that are respectively connected to the micro bumps 47 and that penetrate the silicon substrate 41. The silicon interposer 40A further includes a wiring layer 46 that includes plural first relay lines 43 connected to the vias 42, plural second relay lines 45, and vias 44 that connect the first relay lines 43 to the second relay lines 45. The second relay lines 45 are respectively electrically connected to the through-silicon vias 13 provided at the first semiconductor chip 10B, through the vias 44, the first relay lines 43, the vias 42, the micro bumps 47, and the redistribution layer 16.

FIG. 18 illustrates an arrangement relationship and a connection relationship between the first relay lines 43 and the second relay lines 45 that configure the silicon interposer 40A. Note that the arrangement relationship and the connection relationship between the redistribution layer 16 and the first relay lines 43 provided at the first semiconductor chip 10 is similar to those in the semiconductor device 104 according to the fifth exemplary embodiment (see FIG. 15). Each of the first relay lines 43 extends in the Y direction in FIG. 18. Each of the second relay lines 45 extends in the X direction in FIG. 18, which is orthogonal to the Y direction. Namely, the second relay lines 45 are arranged respectively intersecting the first relay lines 43. Each of the second relay lines 45 extends in a straight line from one end side to another end side of the first semiconductor chip 10B and the second semiconductor chip 20. The second relay lines 45 may have a wiring pattern substantially similar to that of the redistribution layer 16 provided at the first semiconductor chip 10B.

In FIGS. 16 to 18, the letter "V" is appended to the through-silicon vias 13, the wiring of the redistribution layer 16, the first relay lines 43, and the second relay lines 45 applied with the power source potential. Moreover, the letter "G" is appended to the through-silicon vias 13, the wiring of the redistribution layer 16, the first relay lines 43, and the second relay lines 45 applied with the ground potential.

In the silicon interposer 40A, the first relay lines 43 applied with the power source potential are alternatingly arranged with the first relay lines 43 applied with the ground potential. Moreover, in the silicon interposer 40A, the arrangement of the vias 44 is determined such that the second relay lines 45 applied with the power source potential are alternatingly arranged with the second relay lines 45 applied with the ground potential. The second relay lines 45 applied with the power source potential are respectively electrically connected to the plural first relay lines 43 applied with the power source potential, through the vias 44.

Similarly, the second relay lines 45 applied with the ground potential are respectively electrically connected to the plural first relay lines 43 applied with the ground potential, through the vias 44.

The micro bumps 25 of the second semiconductor chip 20 are connected to the second relay lines 45. Namely, the second semiconductor chip 20 is electrically connected to the through-silicon vias 13 provided at the first semiconductor chip 10B, through the second relay lines 45, the first relay lines 43, and the redistribution layer 16. The second semiconductor chip 20 receives a supply of the power source through the through-silicon vias 13, the redistribution layer 16, the first relay lines 43, and the second relay lines 45. Each connection point between the second relay lines 45 and the micro bumps 25 is a power source supply point for the second semiconductor chip 20.

In the semiconductor device 105 according to the sixth exemplary embodiment, a mesh patterned power source supply network is configured by the plural wiring fo the redistribution layer 16 provided at the first semiconductor chip 10B, and the plural first relay lines 43 and the plural second relay lines 45 provided at the silicon interposer 40A. Namely, the plural wiring of the redistribution layer 16 applied with the same potential are connected in parallel by the plural first relay lines 43, and the plural first relay lines 43 applied with the same potential are connected in parallel by the plural second relay lines 45. Accordingly, voltage drop in the power source supply route can be further suppressed compared to cases in which the relay lines configure a single layer structure. Namely, in the semiconductor device 105 according to the sixth exemplary embodiment, the power source supply network between the first semiconductor chip 10B and the second semiconductor chip 20 can be further reinforced.

Moreover, in the silicon interposer 40A, the second relay lines 45 applied with the power source potential are alternatingly arranged with the second relay lines 45 applied with the ground potential. This simplifies routing of power source wiring (not illustrated in the drawings) and ground wiring (not illustrated in the drawings) formed in the wiring layer 24 in the second semiconductor chip 20, and enables the wiring lengths of the power source wiring and the ground wiring to be made shorter, compared to cases in which the above described alternating arrangement is not applied.

Although an example was given of a case in which the silicon interposer 40A was employed as the relay board in the present exemplary embodiment, a relay board in which the first relay lines 43 and the second relay lines 45 are formed on a printed wiring board may also be employed.

Figure 19:
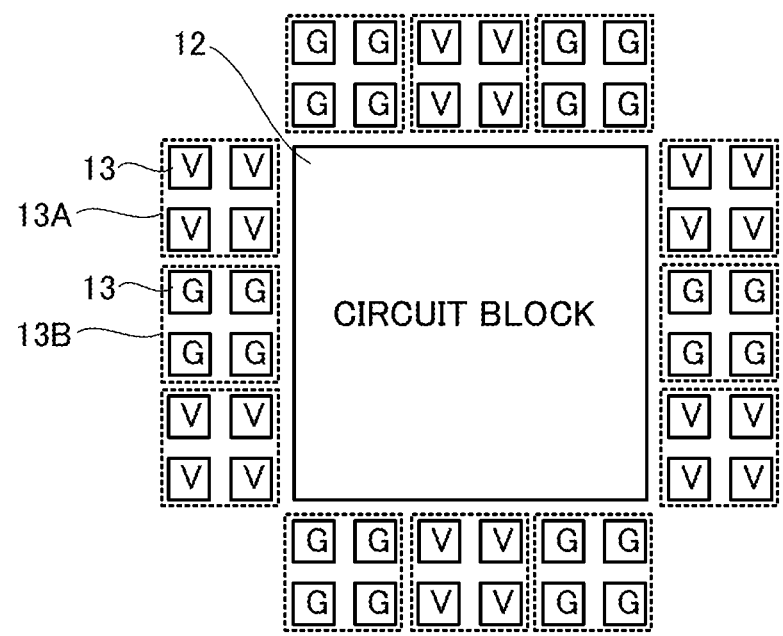
FIG. 19 is a plan view illustrating an arrangement of through-silicon vias in a first semiconductor chip according to an exemplary embodiment of technology disclosed herein.

In each of the exemplary embodiments above, examples have been given of cases in which the through-silicon vias 13 applied with the power source potential are alternatingly arranged with the through-silicon vias 13 applied with the ground potential at the outer periphery of each of the circuit blocks 12; however, there is no limitation to such embodiments. For example, as illustrated in FIG. 19, a group 13A formed from plural through-silicon vias 13 applied with the power source potential may be alternatingly arranged with a group 13B formed from plural through-silicon vias 13 applied with the ground potential at the outer periphery of each of the circuit blocks 12. In such cases, configuration may be made such that the plural through-silicon vias belonging to each group are connected to the same bump 15.

Technology disclosed herein exhibits an advantageous effect of suppressing voltage drop while suppressing a performance decrease in a power source supply between three dimensionally packaged semiconductor chips.

The semiconductor device 100 to 105 are an examples of a semiconductor device of technology disclosed herein. The first semiconductor chip 10, 10A, and 10B are examples of a first semiconductor chip of technology disclosed herein. The circuit block 12 is an example of a circuit block of technology disclosed herein. The through-silicon via 13 is an example of a through-silicon via of technology disclosed herein. The second semiconductor chip 20 and the second semiconductor chip 20A are examples of a second semiconductor chip of technology disclosed herein. The redistribution layer 16 is an example of a redistribution layer of technology disclosed herein. The silicon interposer 40 and the silicon interposer 40A are examples of a relay board of technology disclosed herein. The first relay line 43 is an example of a relay line of technology disclosed herein. The second relay line 45 is an example of a second relay line of technology disclosed herein.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a first semiconductor chip that includes a plurality of circuit blocks provided on a semiconductor substrate, and a plurality of through-silicon vias that are arranged so as to surround the outer periphery of each of the plurality of circuit blocks and that penetrate the semiconductor substrate, the first semiconductor chip includes, at a face on a side at which the second semiconductor chip is stacked, a plurality of redistribution layers electrically connected to the through-silicon vias; and
a second semiconductor chip that is stacked on the first semiconductor chip, and that is supplied with a power source through the plurality of through-silicon vias, at least a single through-silicon via is disposed on each side of the circuit blocks, the second semiconductor chip is electrically connected to the plurality of through-silicon vias through the plurality of redistribution layers,
among the plurality of through-silicon vias, the plurality of redistribution layers are connected to through-silicon vias that are disposed facing each other across the circuit blocks and that are applied with the same potential.

2. The semiconductor device of claim 1, wherein, among the plurality of through-silicon vias, through-silicon vias that are applied with a first potential are alternately arranged with through-silicon vias that are applied with a second potential that is different from the first potential.

3. The semiconductor device of claim 1, wherein, among the plurality of through-silicon vias, through-silicon vias facing each other across the circuit blocks have the same potential.

4. The semiconductor device of claim 1, wherein each of the plurality of circuit blocks is formed with the same size, and the plurality of circuit blocks are arranged on the semiconductor substrate at uniform spacing.

5. The semiconductor device of claim 1, wherein:
the second semiconductor chip includes a plurality of second circuit blocks provided on a second semiconductor substrate, and a plurality of second through-silicon vias that are arranged so as to surround the outer periphery of each of the plurality of second circuit blocks, that penetrate the second semiconductor substrate, and that are electrically connected to the through-silicon vias provided at the first semiconductor chip; and
the semiconductor device further comprises a third semiconductor chip that is stacked on the second semiconductor chip and that is supplied with a power source through the plurality of second through-silicon vias.

6. The semiconductor device of claim 1, wherein each of the plurality of redistribution layers extends in a straight line from one end side of the first semiconductor chip, toward another end side of the first semiconductor chip.

7. The semiconductor device of claim 1, wherein, among the plurality of redistribution layers, each of the plurality of redistribution layers applied with a first potential are alternately arranged with each of the plurality of redistribution layers applied with a second potential that is different from the first potential.

8. The semiconductor device of claim 1, further comprising:
a relay board that is provided between the first semiconductor chip and the second semiconductor chip, and that includes a plurality of first relay lines that are electrically connected to the plurality of redistribution layers;
wherein the second semiconductor chip is electrically connected to the plurality of through-silicon vias through the plurality of first relay lines and the plurality of redistribution layers.

9. The semiconductor device of claim 8, wherein each of the plurality of first relay lines is arranged so as to intersect the plurality of redistribution layers, and is connected to a redistribution layer applied with the same potential among the plurality of redistribution layers.

10. The semiconductor device of claim 8, wherein each of the plurality of first relay lines extends in a straight line from one end side of the first semiconductor chip and the second semiconductor chip, toward another end side of the first semiconductor chip and the second semiconductor chip.

11. The semiconductor device of claim 8, wherein, among the plurality of first relay lines, relay lines applied with a first potential are alternately arranged with relay lines applied with a second potential that is different from the first potential.

12. The semiconductor device of claim 8, wherein the relay board further includes a plurality of second relay lines that are arranged so as to intersect the first relay lines, and that are connected to relay lines applied with the same potential among the plurality of first relay lines.

13. The semiconductor device of claim 12, wherein each of the plurality of second relay lines extends in a straight line from one end side of the first semiconductor chip and the second semiconductor chip, toward another end side of the first semiconductor chip and the second semiconductor chip.

14. The semiconductor device of claim 11, wherein, among the plurality of second relay lines, relay lines applied with the first potential are alternately arranged with relay lines applied with the second potential that is different from the first potential.

15. The semiconductor device of claim 8, wherein the relay board is a silicon interposer.

* * * * *